United States Patent
Yan et al.

(10) Patent No.: US 9,437,742 B2
(45) Date of Patent: Sep. 6, 2016

(54) THIN FILM TRANSISTOR, MANUFACTURING METHOD THEREOF AND ARRAY SUBSTRATE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: ChangJiang Yan, Beijing (CN); Jun Long, Beijing (CN); Xiaohui Zhu, Beijing (CN); Zhenyu Xie, Beijing (CN); Xu Chen, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/348,802

(22) PCT Filed: Sep. 27, 2013

(86) PCT No.: PCT/CN2013/084433
§ 371 (c)(1),
(2) Date: Mar. 31, 2014

(87) PCT Pub. No.: WO2014/173078
PCT Pub. Date: Oct. 30, 2014

(65) Prior Publication Data
US 2015/0084037 A1    Mar. 26, 2015

(30) Foreign Application Priority Data
Apr. 24, 2013    (CN) .......................... 2013 1 0146651

(51) Int. Cl.
*H01L 29/786* (2006.01)
*H01L 23/535* (2006.01)
(Continued)

(52) U.S. Cl.
CPC ....... *H01L 29/78618* (2013.01); *H01L 23/535* (2013.01); *H01L 27/1225* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 2004/0135209 A1* | 7/2004 | Hsieh ........................ | G01J 5/02 257/368 |
| 2006/0030084 A1 | 2/2006 | Young | |

(Continued)

FOREIGN PATENT DOCUMENTS

| | | |
|---|---|---|
| CN | 1678952 A | 10/2005 |
| CN | 101183197 A | 5/2008 |

(Continued)

OTHER PUBLICATIONS

Sato et al., Amorphous In—Ga—Zn—O thin-film transistor with coplanar homojunction structure, Thin Solid Films, 2009, vol. 518, pp. 1309-1313.

(Continued)

*Primary Examiner* — Mohammad Islam
*Assistant Examiner* — Ratisha Mehta
(74) *Attorney, Agent, or Firm* — Ladas & Parry LLP

(57) ABSTRACT

A thin film transistor, a manufacturing method thereof and an array substrate are provided. The thin film transistor includes: a gate electrode (102) formed on a substrate (101), a gate insulating layer (103) formed on the gate electrode (102) and covering at least a part of the substrate (101), and a semiconductor layer (105'), a source electrode (107*a*) and a drain electrode (107*b*) which are formed on the gate insulating layer (103). The material of the semiconductor layer (105') is an oxide semiconductor; and the material of the source electrode (107*a*) and drain electrode (107*b*) is the oxide semiconductor which is doped. The source electrode (107*a*), the drain electrode (107*b*) and the semiconductor layer (105') are disposed in the same layer.

6 Claims, 4 Drawing Sheets

(51) Int. Cl.
*H01L 29/66* (2006.01)
*H01L 27/12* (2006.01)

(52) U.S. Cl.
CPC ..... *H01L29/66969* (2013.01); *H01L 29/7869* (2013.01); *H01L 29/78693* (2013.01); *H01L 2924/0002* (2013.01)

(56) References Cited

U.S. PATENT DOCUMENTS

| | | | |
|---|---|---|---|
| 2007/0210257 A1* | 9/2007 | Masuda | G01T 1/2018 250/370.09 |
| 2008/0111779 A1 | 5/2008 | Matsumoto | |
| 2008/0135890 A1* | 6/2008 | Nakagawa | H01L 21/2254 257/288 |
| 2008/0303020 A1 | 12/2008 | Shin et al. | |
| 2009/0026509 A1 | 1/2009 | Hayashi et al. | |
| 2010/0051819 A1 | 3/2010 | Jung et al. | |
| 2011/0204246 A1 | 8/2011 | Tanaka et al. | |
| 2012/0235026 A1* | 9/2012 | Wu | H01L 27/14663 250/214 P |
| 2013/0122649 A1* | 5/2013 | Zhang | H01L 29/66742 438/104 |
| 2013/0320328 A1* | 12/2013 | Lee | H01L 29/7869 257/43 |

FOREIGN PATENT DOCUMENTS

| | | |
|---|---|---|
| CN | 101308856 A | 11/2008 |
| CN | 102196194 A | 5/2009 |
| CN | 102629610 A | 8/2012 |
| CN | 102916085 A | 2/2013 |
| CN | 103018990 A | 4/2013 |

OTHER PUBLICATIONS

International Search Report for International Application No. PCT/CN2013/084433 issued Jan. 6, 2014, 15pgs.
International Preliminary Report on Patentability issued Oct. 27, 2015; PCT/CN2013/084433.
First Chinese Office Action dated Jul. 4, 2016; Appln. No. 201310146651.7.

* cited by examiner

THIN FILM TRANSISTOR, MANUFACTURING METHOD THEREOF AND ARRAY SUBSTRATE

CROSS REFERENCE TO RELATED APPLICATIONS

This application is based on International Application No. PCT/CN2013/084433 filed on Sep. 27, 2013, which claims priority to Chinese National Application No. 201310146651.7 filed on Apr. 24, 2013. The entire contents of each and every foregoing application are incorporated herein by reference.

FIELD OF THE ART

Embodiments of the present invention relate to thin film transistor, manufacturing method thereof and array substrate.

BACKGROUND

At present, oxide thin film transistors are mainly zinc oxide based thin film field effect transistors of polycrystalline oxide semiconductor materials, while non-crystalline oxide semiconductors such as oxide thin film transistor adopting indium-gallium-zinc oxide (IGZO) semiconductor as the semiconductor layer, have been paid much attention to in the liquid crystal industry due to their advantageous properties such as high mobility, low subthreshold value, low current and low temperature fabrication process. However, there are still some problems to be solved with regard to the existing non-crystalline oxide semiconductor thin film transistors. For example, it is difficult to form good electrical contact between source and drain electrodes formed of metal material and semiconductor layer of non-crystalline oxide.

Oxide thin film transistors may be applied to X ray flat detection devices. A sectional structure of an existing oxide thin film transistor includes as shown in FIG. 1:

a gate electrode 902 formed on a substrate 901;

a gate insulating layer 903 formed on the gate electrode 902 and covering the entire substrate 901;

a semiconductor layer 905 formed on the gate insulating layer 903;

an ohmic contact layer 906 formed on the semiconductor layer 905;

source and drain electrodes 907 formed on the ohmic contact layer 906;

a signal terminal (PIN), formed on the drain 907, consisting of a P-type layer 908, an I-type layer 909 and a N-type layer 910;

a conducting layer 911 formed on the N-type layer 910;

a first passivation layer 912 covering the source and drain electrodes 907, the semiconductor layer 905 and the conducting layer 911;

a first electrode 913 disposed on the first passivation layer 912 and connected with the conducting layer 911;

a second electrode 915 disposed on the second passivation layer 914 and the first passivation layer 912 and connected with the source electrode, In the existing oxide thin film transistor, the signal terminal is a photodiode with PIN structure. By applying a voltage to the conducting layer 911, the first electrode 913 connected with the conducting layer 911 has a voltage, and liquid crystal molecules above the oxide thin film transistor rotate under the control of the electric field. A photosensitive layer (not shown in FIG. 1) is further provided correspondingly on the PIN. Incident light hits the photosensitive layer after passing through the liquid crystal molecule layer. Then, the PIN is in reverse conducting due to a voltage difference existing between the conducting layer 911 over the PIN and the underlying drain electrode 907b, which converts a light signal into an electrical signal and transmits it to the drain electrode 907b.

At the same time, a voltage is applied to the gate 902. Therefore, the electrical signal passes from the drain electrode 907b through the ohmic contact layer 906 and the semiconductor layer 905 and arrives at the source electrode 907a. The second electrode 915 connected with the source electrode 907a obtains the signal. The second electrode 915 is further connected with a detection circuit of the flat detection device and therefore can detect intensity information of the X ray for example.

The above-mentioned source and drain electrodes 907 is generally made of metal such as aluminum, molybdenum, titanium and indium oxide. The electrical characteristics of this kind of oxide thin film transistors tend to be influenced by carriers in the semiconductor layers 905, making the interfacial contact resistance between the source and drain electrodes 907 and the semiconductor layer 905 form a heterojunction or a homojunction, which greatly influences the driving current. Although the existing oxide thin film transistors adopts the ohmic contact layer 906 disposed between the source and drain electrodes 907 and the semiconductor layer 905 to decrease contact resistance, a certain resistance still exists due to the difference in valence bands of the metal and the semiconductor.

SUMMARY

An embodiment of the invention provides a thin film transistor comprising: a gate electrode formed on a substrate, a gate insulating layer formed on the gate electrode and covering at least a part of the substrate, and a semiconductor layer, a source and a drain formed on the gate insulating layer; wherein the material of the semiconductor layer is an oxide semiconductor, the material of the source and drain electrodes is the oxide semiconductor which is doped, and the source electrode, the drain electrode and the semiconductor layer are disposed in the same layer.

In an example, the semiconductor layer is a non-crystalline oxide semiconductor layer.

In an example, the source electrode, the drain electrode and the semiconductor layer are formed from the same layer of material.

In an example, the thin film transistor further comprises a barrier layer formed on the semiconductor layer, wherein the source and drain electrodes are located on two sides of the barrier layer respectively.

In an example, the thin film transistor further comprises a signal terminal formed on the drain electrode, wherein the signal terminal is a photodiode of PIN structure comprising a P-type layer of highly doped hydrogenated non-crystalline silicon formed on the drain electrode, an I-type layer formed on the P-type layer, and a N-type layer formed on the I-type layer.

In an example, the thin film transistor further comprises a conducting layer formed on the N-type layer of the signal terminal.

In an example, the thin film transistor further comprises a first passivation layer formed on the conducting layer, wherein a first via hole corresponding to the region of the drain electrode and a second via hole corresponding to the region of the source electrode are formed in the first passivation layer.

In an example, the thin film transistor further comprises a first electrode and a second electrode formed on the first passivation layer and a second passivation layer formed on the first electrode and the second electrode, wherein the first electrode is electrically connected with the conducting layer through the first via hole, the second electrode is electrically connected with the source electrode through the second via hole.

In an example, the first passivation layer and/or the second passivation layer is formed of highly doped silicon nitride material.

Another embodiment of the invention provides an array substrate comprising any of the thin film transistors described above.

A further embodiment of the invention provides a manufacturing method of a thin film transistor comprising steps of: forming a gate electrode on a substrate; forming a gate insulating layer on the gate electrode and at least a part of the substrate; forming an oxide semiconductor thin film layer on the substrate with the gate insulating layer formed thereon; performing a doping process to the oxide semiconductor thin film layer so as to form a source electrode, a drain electrode and a semiconductor layer interposed between the source and drain electrodes.

In an example, the step of performing the doping process to the oxide semiconductor thin film layer so as to form the source electrode, the drain electrode and the semiconductor layer interposed between the source and drain electrodes comprises forming a barrier layer on the oxide semiconductor thin film layer; performing a doping treatment to the oxide semiconductor thin film layer on both sides of the barrier layer so as to form the source and drain electrodes.

In an example, the manufacturing method of the thin film transistor further comprises forming a signal terminal on the source electrode, wherein the step of performing a doping treatment to the oxide semiconductor thin film layer on both sides of the barrier layer so as to form the source and drain electrodes comprises forming a highly doped hydrogenated non-crystalline silicon layer on the oxide semiconductor thin film layer and the barrier layer; patterning the highly doped hydrogenated non-crystalline silicon layer so as to form the P-type layer of the signal terminal.

In an example, the step of forming the signal terminal on the drain electrode comprises: sequentially forming an I-type layer and a N-type layer on the P-type layer of highly doped hydrogenated non-crystalline silicon, wherein the I-type layer is formed of intrinsic silicon and the N-type layer is formed of N-type doped silicon.

In an example, the manufacturing method of the thin film transistor further comprises forming a conducting layer on the signal terminal.

In an example, the manufacturing method of the thin film transistor further comprises forming a first passivation layer on the conducting layer; forming a first via hole and a second via hole in the first passivation layer, wherein the first via hole corresponds to the region of the drain electrode, and the second via hole corresponds to the region of the source electrode.

In an example, the manufacturing method of the thin film transistor further comprises forming a first electrode and a second electrode on the first passivation layer, and forming a second passivation layer on the first electrode and the second electrode, wherein the first electrode is electrically connected with the conducting layer through the first via hole, and the second electrode is electrically connected with the drain electrode through the second via hole.

BRIEF DESCRIPTION OF THE DRAWINGS

In order to clearly illustrate the technical solution of the embodiments of the invention, the drawings to be used in description of embodiments and prior art will be briefly described in the following; it is obvious that the described drawings are only related to some embodiments of the invention and thus are not limitative of the invention.

DETAILED DESCRIPTION

Hereinafter, the technical solutions of the embodiment will be described in a clearly and fully understandable way in connection with the drawings. It is obvious that the described embodiments are just a part but not all of the embodiments of the invention. Based on the described embodiments herein, those skilled in the art can obtain other embodiment(s), without any inventive work, which should be within the scope of the invention.

An embodiments of the present invention provides a non-crystalline oxide thin film transistor different from a polycrystalline oxide thin film transistor in prior art. An embodiment of the present invention provides an array substrate for non-crystalline silicon detectors instead of a common array substrate in an existing display. Embodiments of the present invention mainly provide a thin film transistor and a manufacturing method thereof and an array substrate that can effectively solve the problem of poor electrical contact between the source and drain electrodes and the non-crystalline oxide semiconductor layer.

The basic concept of embodiments of the present invention is that highly doped non-crystalline silicon thin film is directly deposited on an oxide semiconductor thin film layer on both sides of a barrier layer when source and drain electrodes are formed so as to increase the concentration of carriers at interface of the oxide semiconductor such that the oxide semiconductor can exhibit electrical characteristics of conductor and thereby form the source and drain electrodes.

Specific embodiments of the present invention will be described in detail below with reference to the accompanying drawings.

Figure 1:
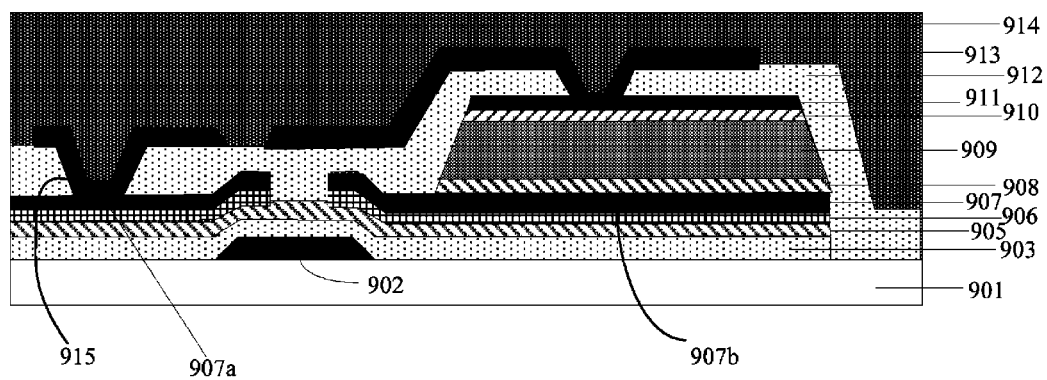
FIG. 1 is a partial sectional structural diagram of an array substrate in an existing X ray detection device.
Figure 2:
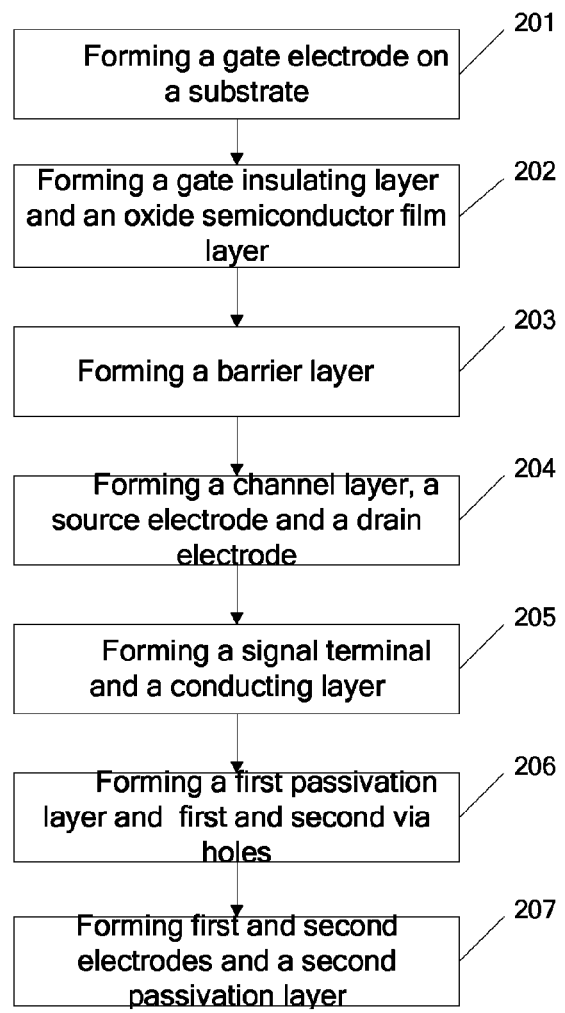
FIG. 2 is a flowchart of a manufacturing method of a thin film transistor according to an embodiment of the present invention.
Figure 3:
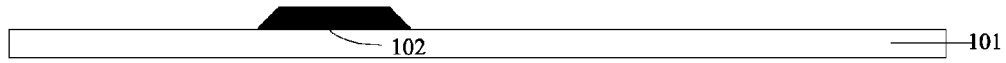
FIG. 3 is a structural representation of the thin film transistor after forming a gate electrode in the embodiment of the present invention.

FIG. 2 is a flowchart of a manufacturing method of a thin film transistor according to an embodiment of the present invention. As shown in FIG. 2, the manufacturing method includes:

Step 201: forming a gate electrode onto a substrate;

For example, a thin film for gate layer is formed onto the substrate 101 and patterned to form the gate electrode 102. Here, the gate 102 can adopt metal materials such as aluminum, copper or molybdenum and can be formed by wet etching process. A well-known patterning process can be used in this step which will not be described in detail here. The structure thus formed is shown in FIG. 3.

Step 202: forming a gate insulating layer covering the gate electrode and at least a part of the substrate and an oxide semiconductor thin film layer onto the substrate with the gate electrode formed thereon;

gate insulating material such as silicon oxide is coated on the substrate 101 with the gate electrode 102 formed thereon by using a sputtering deposition method such as the physical sputtering method for example; and then an well-known patterning process can be used to form the gate insulating layer 103.

Figure 4:
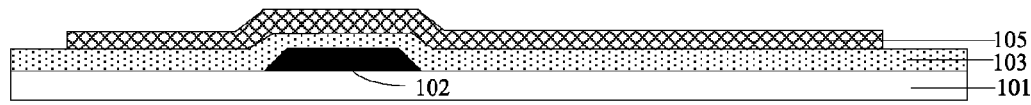
FIG. 4 is a structural representation of the thin film transistor after forming a semiconductor layer in the embodiment of the present invention.

A non-crystalline oxide semiconductor thin film such a-IGZO thin film is deposited onto the gate insulating layer 103; and a non-crystalline oxide semiconductor thin film layer 105 is formed with wet etching process, thus obtaining the structure shown in FIG. 4, wherein the non-crystalline oxide semiconductor material can also adopt other materials such as hafnium-indium-zinc oxide (HfInZnO) or indium-gallium-tin oxide (InGaSnO), the description of which is omitted here.

Figure 5:
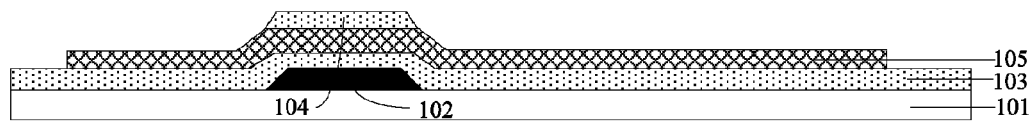
FIG. 5 is a structural representation of the thin film transistor after forming a barrier layer in the embodiment of the present invention.

Step 203: forming a barrier layer onto the substrate with the oxide semiconductor thin film layer formed thereon;

For example, a silicon dioxide thin film is deposited onto the substrate with the non-crystalline oxide semiconductor thin film layer 105 formed thereon and patterned by a dry etching process so as to form a barrier layer 104. The barrier layer 104 may be implemented with well-known process and will not be described in detail here. The structure formed after this step is shown in FIG. 5.

Figure 6:
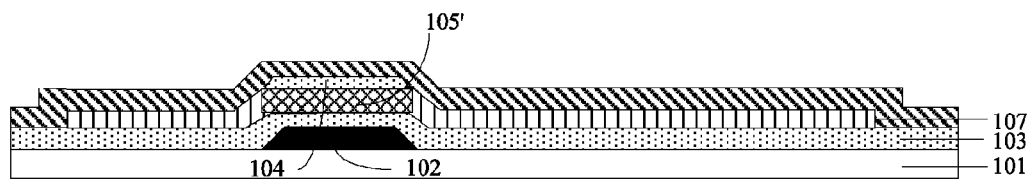
FIG. 6 is a structural representation of the thin film transistor after forming source and drain electrodes in the embodiment of the present invention.

Step 204: depositing a highly doped non-crystalline silicon thin film onto the oxide semiconductor thin film layer on both sides of the barrier layer so as to form source and drain electrodes;

For example, highly doped non-crystalline silicon such as a-Si:H is deposited onto the non-crystalline oxide semiconductor thin film layer 105 on both sides of the barrier layer 104 by using a plasma enhanced chemical vapor deposition method (PECVD). Thus, carrier concentration at the interface between the non-crystalline oxide semiconductor thin film layer 105 and the non-crystalline silicon thin film increases. Then, the non-crystalline oxide semiconductor thin film layers at the interface exhibit electrical characteristics of conductor and thus forms the source and drain electrodes 107, while the non-crystalline oxide semiconductor thin film layer which is un-doped, i.e. the non-crystalline oxide semiconductor thin film layer covered by the barrier layer 4 forms the semiconductor layer 105', as shown in FIG. 6.

In this case, an improved resistance characteristics at the interface between the semiconductor layer 105' consisting of non-crystalline oxide semiconductor and the source and drain electrodes 107 and increased driving current can be obtained, thereby effectively avoiding poor electrical contact between the source drain electrodes 107 and the non-crystalline oxide semiconductor layer 105' and advantageously improving display quality of the device.

In the above-mentioned embodiment of the present invention, a layer of metal material for forming the source and drain electrodes is not required to be additionally deposited. That is, the mask forming process for the source drain electrodes is omitted. Therefore, the production cost is reduced.

Figure 7:
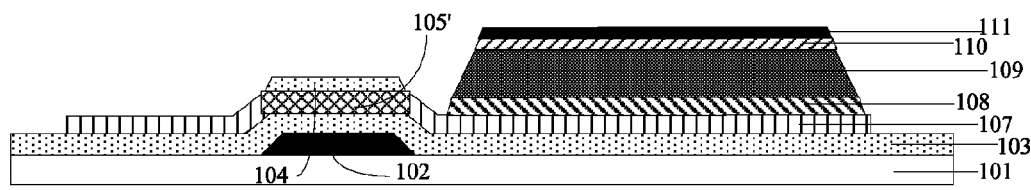
FIG. 7 is a structural representation of the thin film transistor after forming a signal terminal in the embodiment of the present invention.

Step 205: forming a signal terminal (PIN) and a conducting layer onto the substrate with the source and drain electrode formed thereon;

For example, sequentially depositing an intrinsic silicon thin film, a N-type doped silicon ($n^+Si$) thin film and an ITO thin film onto the substrate with the highly doped non-crystalline silicon thin film deposited thereon. The ITO thin film is etched by a wet etching process and the $n^+$ Si thin film, the intrinsic silicon thin film and the highly doped non-crystalline silicon (a-Si:H) thin film are etched by a dry etching process so as to form a P-type layer 108, an I-type layer 109 on the P-type layer 108 and a N-type layer 110 formed on the I-type layer 109, and a conducting layer 111 on the N-type layer 110, as shown in FIG. 7. The materials of the P-type layer 108, the I-type layer 109 and the N-type layer 110 are highly doped hydrogenated non-crystalline silicon, intrinsic silicon and N-type doped silicon ($n^+$ Si) respectively.

Figure 8:
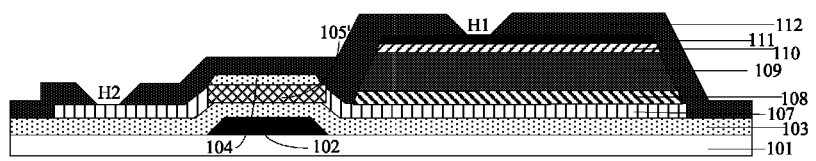
FIG. 8 is a structural representation of the thin film transistor after forming a first passivation layer in the embodiment of the present invention.

Step 206: forming a first passivation layer and first and second vias on the substrate with the signal terminal PIN formed thereon;

Optionally, a highly doped silicon nitride thin film is deposited onto the substrate with the PIN formed thereon(for example onto the conducting layer 111 on the PIN); and a first passivation layer 112 is formed by a dry etching process. In the first passivation layer, a first via hole H1 corresponding to the region of the drain electrode and a second via hole H2 corresponding to the region of the source electrode are formed, resulting in the structure shown in FIG. 8.

Instead of silicon dioxide thin film used in prior art, a highly doped silicon nitride thin film is used to form the first passivation layer 112 herein, such that the electrical performance of the source and drain electrodes 107 formed of non-crystalline oxide semiconductor can be further improved.

Figure 9:
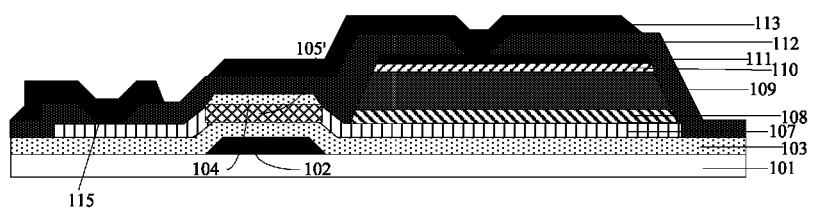
FIG. 9 is a structural representation of the thin film transistor after forming a second pixel electrode in the embodiment of the present invention.

Step 207: sequentially forming a first electrode, a second electrode and a second passivation layer onto the first passivation layer;

For example, a ITO thin film is deposited onto the first passivation layer 112 and undergoes a wet etching process to form the first electrode 113 electrically connected with the conducting layer 111 through the first via hole H1 and the second electrode 115 electrically connected with the source electrode through the second via hole H2, resulting in the structure shown in FIG. 9. A highly doped silicon nitride thin film is deposited onto the first electrode 113 and the second electrode 115; and a second passivation layer 114 for preventing the influence from external environment (water, air, etc.) is formed by a dry etching process, resulting in the structure shown in FIG. 10.

Figure 10:
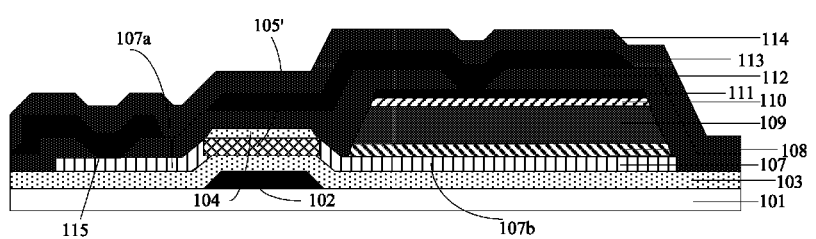
FIG. 10 is a structural representation of the thin film transistor after forming a second passivation layer in the embodiment of the present invention.

Hereinafter, the structure of the thin film transistor provided by the embodiment of the present invention will be described. As shown in FIG. 10, the thin film transistor provided by the embodiment of the present invention includes: the gate electrode 102 formed on the substrate 101, the gate insulating layer 103 formed on the gate electrode 102 and covering the entire substrate 101, the semiconductor layer 105' formed on the gate insulating layer 103, and the source and drain electrodes 107 located on both sides of the semiconductor layer 105', wherein the source and drain electrodes 107 include a source electrode 107a and a drain electrode 107b located on two sides of the semiconductor layer 105' respectively. The thin film transistor provided by the embodiment of the present invention further includes a barrier layer 104 formed on the semiconductor layer 105' and a signal terminal (PIN) formed on the drain electrode 107b.

In the thin film transistor, the PIN includes the P-type layer 108 of highly doped hydrogenated non-crystalline silicon formed on the drain electrode 107b, the I-type layer 109 formed on the P-type layer 108 and the N-type layer 110 formed on the I-type layer 109. The thin film transistor further includes the conducting layer 111 formed on the N-type layer 110.

In the thin film transistor, the source and drain electrodes 107 and the semiconductor layer 105' are located within the same oxide semiconductor thin film layer and have the same thickness. That is, the source electrode 107a, the drain electrode 107b, and the semiconductor layer 105' are formed into a single thin film layer; and all of them are formed of oxide semiconductor material.

As can be seen in FIG. 10, the thin film transistor further includes the first passivation layer 112 formed on the conducting layer 111, the first and second via holes located in the first passivation layer 112, wherein the first and second via holes correspond to the region of the drain electrode 107b and the region of the source 107a respectively.

Optionally, the thin film transistor further includes the first electrode 113 and the second electrode 115 formed on the first passivation layer 112, and the second passivation layer 114 formed on the first electrode 113 and the second electrode 115, wherein the first electrode 113 is electrically connected with the conducting layer 111 through the first via hole and the second electrode 115 is electrically connected with the source electrode 107a through the second via hole.

Preferably, highly doped silicon nitride material is used for the first passivation layer 112 and the second passivation layer 114.

As can be seen from the above-mentioned manufacturing method of the thin film transistor, compared with the prior art, the manufacturing process of the thin film transistor provided by the embodiment of the present invention omits the patterning process for the source and drain electrodes, thus saving mask costs and simplifying the manufacturing processes.

In an embodiment of the present invention, after applying a voltage to the gate electrode 102, electrical signals is transmitted from the drain electrode 107b through the semiconductor layer 105' to the source electrode 107a; and the second electrode 115 connected with the source electrode 107a obtains the signals. The second electrode 115 is connected with the detection circuit of the flat detection device, therefore can detect the intensity information of X ray.

Furthermore, an embodiment of the present invention further provides an array substrate, in which the above-mentioned thin film transistors are adopted.

In the thin film transistor and the manufacturing method provided in embodiments of the present invention, highly doped non-crystalline silicon thin film is directly deposited onto the oxide semiconductor thin film layer on both sides of the barrier layer during the formation of the source and drain electrodes of the thin film transistor. When highly doped non-crystalline silicon is deposited on the surface of the oxide semiconductor, since a large amount of unsaturated hydrogen bonds exist within the highly doped non-crystalline silicon, hydrogen ions are caused to diffuse into the non-crystalline metal oxide semiconductor layer such that a region at the surface of the non-crystalline metal oxide close to the highly doped non-crystalline silicon thin film is highly doped with H ions and thus exhibiting conductive properties. Since the highly doped non-crystalline silicon thin film can provide a lot of carriers, the non-crystalline oxide semiconductor thin film at the interface between the highly doped non-crystalline silicon thin film and the non-crystalline oxide semiconductor film exhibits electrical characteristics of conductor, thereby forming the source and drain electrodes. Furthermore, in the thin film transistor provided by embodiments of the present invention, due to the small difference between the energy levels of the valence bands of the source and drain electrodes and the semiconductor layer which are formed of the same material and the good lattice matching, driving current signals is less influenced and the obstacle to electron flowing is reduced. Therefore, the problem of poor electrical contact between the source and drain electrodes and the non-crystalline oxide semiconductor layer can be effectively solved, and it is possible to improve electrical characteristics of the thin film transistor and the display quality of the device.

Furthermore, in embodiments of the present invention, it is not required to additionally deposit a layer of metal material for forming the source and drain electrodes. That is, the mask forming process for the source and drain electrodes is omitted, thereby reducing the production costs.

Although the present invention has been described in detail with general description and specific implementations, some modifications or improvements may be made on the basis of the present invention, which will be obvious for those skilled in the art. Therefore, these modifications or improvements made without departing from the spirit of the present invention fall within the protection scope claimed by the present invention.

What is claimed is:

1. A manufacturing method of a thin film transistor comprising steps of:
    forming a gate electrode on a substrate;
    forming a gate insulating layer on the gate electrode and at least a part of the substrate;
    forming a non-crystalline oxide semiconductor thin film layer on the gate insulating layer;
    forming a barrier layer on the non-crystalline oxide semiconductor thin film layer;
    depositing a highly doped semiconductor thin film directly onto two portions of the oxide semiconductor thin film layer which are located on two opposite sides of the barrier layer and not covered by the barrier layer to increase carrier concentration at the interface between the non-crystalline oxide semiconductor thin film layer and the non-crystalline silicon thin film, so that the portions of the non-crystalline oxide semiconductor thin film layer at the interface exhibit electrical characteristics of conductor and thus form source and drain electrodes respectively,
    wherein the highly doped semiconductor thin film is a highly doped hydrogenated non-crystalline silicon thin film.

2. The manufacturing method of the thin film transistor of claim 1, further comprising forming a signal terminal in direct contact with the drain electrode, wherein the signal terminal includes a P-type layer, a I-type layer and a N-type layer,
- the highly doped hydrogenated non-crystalline silicon layer directly on the drain electrode forms the P-type layer of the signal terminal.

3. The manufacturing method of the thin film transistor of claim 2, wherein the step of forming the signal terminal in direct contact with the drain electrode comprises:
- sequentially forming the I-type layer and the N-type layer on the P-type layer, wherein the I-type layer is formed of intrinsic silicon and the N-type layer is formed of N-type doped silicon.

4. The manufacturing method of the thin film transistor of claim 2, further comprising:
- forming a conducting layer on the signal terminal.

5. The manufacturing method of the thin film transistor of claim 4, further comprising:
- forming a first passivation layer on the conducting layer;
- forming a first via hole and a second via hole in the first passivation layer, wherein the first via hole corresponds to the region of the drain electrode, and the second via hole corresponds to the region of the source electrode.

6. The manufacturing method of the thin film transistor of claim 5, further comprising:
- forming a first electrode and a second electrode on the first passivation layer, and forming a second passivation layer on the first electrode and the second electrode, wherein the first electrode is electrically connected with the conducting layer through the first via hole, and the second electrode is electrically connected with the source electrode through the second via hole.

* * * * *